(12) United States Patent
Nakamura et al.

(10) Patent No.: US 10,652,994 B2
(45) Date of Patent: May 12, 2020

(54) CIRCUIT ASSEMBLY WITH INCREASED MOUNTING AREA

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Arinobu Nakamura, Mie (JP); Tou Chin, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

(*) Notice: Subject to any disclaimer, the term of this patent is extended or adjusted under 35 U.S.C. 154(b) by 0 days.

(21) Appl. No.: 15/767,376

(22) PCT Filed: Oct. 21, 2016

(86) PCT No.: PCT/JP2016/081231
§ 371 (c)(1),
(2) Date: Apr. 11, 2018

(87) PCT Pub. No.: WO2017/077879
PCT Pub. Date: May 11, 2017

(65) Prior Publication Data
US 2018/0310410 A1    Oct. 25, 2018

(30) Foreign Application Priority Data
Nov. 4, 2015  (JP) ................................. 2015-216291

(51) Int. Cl.
*H05K 1/02*    (2006.01)
*H01L 23/367*  (2006.01)
(Continued)

(52) U.S. Cl.
CPC ......... *H05K 1/0203* (2013.01); *H01L 23/367* (2013.01); *H01L 24/00* (2013.01);
(Continued)

(58) Field of Classification Search
CPC ...... H05K 1/181; H05K 1/0203; H05K 1/116; H05K 1/18; H05K 7/20509;
(Continued)

(56) References Cited

U.S. PATENT DOCUMENTS

| 7,154,753 B2 * | 12/2006 | Kobayashi | ........... H05K 1/0203 |
| | | | 361/715 |
| 2014/0225482 A1 * | 8/2014 | Hara | ........................ H02K 5/22 |
| | | | 310/68 D |

FOREIGN PATENT DOCUMENTS

| JP | 2002-076220 A | 3/2002 |
| JP | 2005-032833 A | 2/2005 |

(Continued)

OTHER PUBLICATIONS

Search Report for PCT/JP2016/081231, dated Dec. 20, 2016.

*Primary Examiner* — Zachary Pape
(74) *Attorney, Agent, or Firm* — Honigman LLP

(57) ABSTRACT

Provided is a circuit assembly in which the mounting area of a substrate can be increased. A circuit assembly includes an electronic component having a plurality of terminals, a conductive member for supporting the electronic component (10), at least one of the terminals of the electronic component being electrically connected to the conductive member, and a substrate provided with a conductive pattern to which another terminal of the electronic component is electrically connected, in which the substrate is fixed to a surface of the conductive member that is opposite to a surface of the conductive member that supports the electronic component.

8 Claims, 3 Drawing Sheets

(51) Int. Cl.
  *H05K 7/20* (2006.01)
  *H05K 1/18* (2006.01)
  *H01L 23/00* (2006.01)
  *H05K 1/11* (2006.01)

(52) U.S. Cl.
  CPC .......... *H05K 1/116* (2013.01); *H05K 1/181* (2013.01); *H05K 7/20509* (2013.01); *H05K 1/0265* (2013.01); *H05K 7/20409* (2013.01); *H05K 2201/066* (2013.01); *H05K 2201/093* (2013.01); *H05K 2201/09336* (2013.01); *H05K 2201/09345* (2013.01); *H05K 2201/09736* (2013.01); *H05K 2201/10166* (2013.01); *H05K 2201/10303* (2013.01); *H05K 2201/10553* (2013.01); *H05K 2201/10818* (2013.01)

(58) Field of Classification Search
  CPC ... H05K 2201/093; H05K 2201/09336; H05K 2201/10166; H05K 2201/10303; H05K 2201/10553; H05K 2201/10818; H01L 23/367; H01L 24/00
  USPC .......................... 361/704–719; 257/713, 717
  See application file for complete search history.

(56) References Cited

FOREIGN PATENT DOCUMENTS

| | | |
|---|---|---|
| JP | 2008-054449 A | 3/2008 |
| JP | 2009-284600 A | 12/2009 |
| JP | 2010-166700 A | 7/2010 |

* cited by examiner

CIRCUIT ASSEMBLY WITH INCREASED MOUNTING AREA

TECHNICAL FIELD

The present invention relates to a circuit assembly including a substrate and a conductive member.

BACKGROUND ART

Circuit assemblies obtained by providing a conductive pattern on one side of a substrate and fixing a plate-shaped conductive member (also referred to as "bus bar" or the like) to the other side of the substrate are known (for example, see Patent Document 1 below).

CITATION LIST

Patent Documents
Patent Document 1: JP 2003-164040A

SUMMARY OF INVENTION

Technical Problem

In a circuit assembly disclosed in Patent Document 1 above, in order to mount an electronic component on the conductive member, a hole (through-hole 22 in Patent Document 1 above) through which the electronic component passes needs to be formed in the substrate, and accordingly, the mounting area (the area of a portion on which an electronic component can be mounted or a conductive pattern can be formed) of the substrate decreases.

An issue resolved by the present invention is to provide a circuit assembly in which the mounting area of a substrate can be increased.

Solution to Problem

A circuit assembly according to the present invention made in order to resolve the above-described issue includes an electronic component having a plurality of terminals, a conductive member supporting the electronic component, at least one of the terminals of the electronic component being electrically connected to the conductive member, and a substrate provided with a conductive pattern to which another terminal or other terminals of the electronic component are electrically connected, in which the substrate is fixed to a surface of the conductive member that is opposite to a surface of the conductive member that supports the electronic component.

With the above-described circuit assembly according to the present invention, it is not necessary to form a through-hole for passing an electronic component through the substrate because the substrate is fixed to the surface of the conductive member that is opposite to the surface of the conductive member that supports the electronic component, and accordingly, it is possible to increase the mounting area of the substrate.

The conductive member does not overlap with at least one of the other terminals of the electronic component.

If the conductive member does not overlap with at least one of the other terminals of the electronic component in this manner, this terminal can be easily connected to the substrate. Also, it is possible to avoid the complication of a structure in which the substrate is fixed to the surface that is opposite to the surface of the conductive member that supports the electronic component.

The circuit assembly includes a relay member for linking the other terminal or terminals of the electronic component and the conductive pattern of the substrate.

Use of such a relay member makes it possible to easily electrically connect the other terminals of the electronic component and the conductive pattern of the substrate.

The circuit assembly includes a heat dissipation member that is in direct or indirect contact with the surface of the conductive member that supports the electronic component.

The heat dissipation member can be fixed to the surface of the conductive member that supports the electronic component. Because no substrate is present on this surface side, there are not much restrictions on the shape and the size of the heat dissipation member, for example. Thus, its heat dissipation efficiency can be increased.

An accommodation space for accommodating the electronic component is formed in the heat dissipation member on the conductive member side.

Doing this makes it possible to prevent the electronic component from getting in the way of the heat dissipation member.

The electronic component and the heat dissipation member are in direct or indirect contact with each other.

Doing this makes it possible to effectively dissipate heat generated in the electronic component via the heat dissipation member (form a structure in which the entire space between the electronic component and the heat dissipation member is not an air layer).

Advantageous Effects of Invention

According to the present invention, it is possible to increase the mounting area (the mountable area) of a substrate that constitutes a circuit assembly.

DESCRIPTION OF EMBODIMENTS

Figure 1:
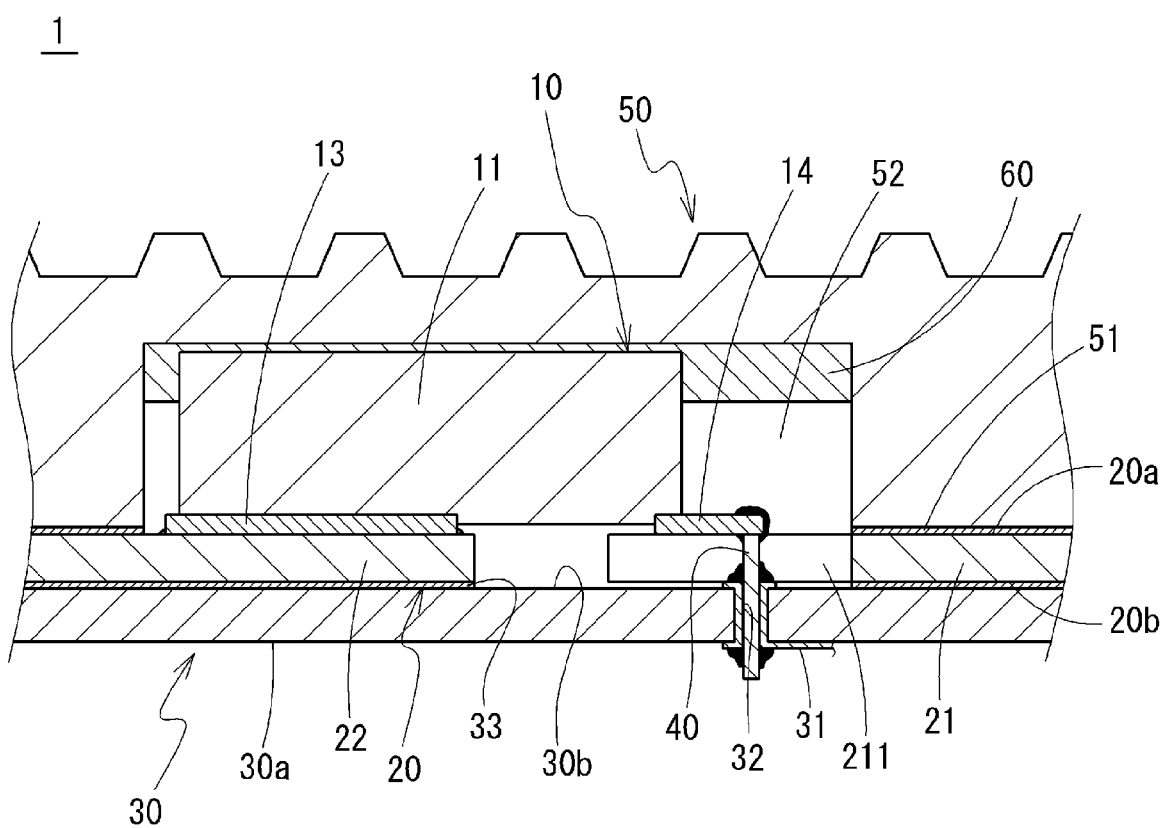
FIG. 1 is a cross-sectional view of a circuit assembly according to one embodiment of the present invention.

Hereinafter, an embodiment of the present invention will be described in detail with reference to the drawings. Note that unless indicated otherwise, "surface direction" in the description below refers to a direction along a substrate and conductive members 20, which are plate-shaped members, and "height direction" (vertical direction) refers to a direction orthogonal to the surface direction. Note that these directions are used for the description and do no limit a direction in which a circuit assembly 1 is installed.

The circuit assembly 1 according to one embodiment of the present invention will be described with reference to FIGS. 1 to 3. The circuit assembly 1 according to the present embodiment includes electronic components 10, a conductive member 20, and a substrate 30.

The electronic components 10 are supported on an upper surface (also referred to as "support surface 20a" hereinafter) of the conductive member 20, and has a main body 11 and a plurality of terminals. The terminals of the electronic component 10 in the present embodiment can be classified into terminals that are electrically connected to the conductive member 20 and a terminal that is electrically connected to a conductive pattern 31 (wiring pattern) formed on the substrate 30. More specifically, the terminals can be classified into a terminal that is electrically connected to a first conductor 21 of the conductive member 20, a terminal that is electrically connected to a second conductor 22 of the conductive member 20, and terminals that are electrically connected to the conductive pattern 31 formed on the substrate 30, which will be described in detail later. Hereinafter, the terminal that is electrically connected to the first conductor 21 is referred to as "first terminal 12", the terminal that is electrically connected to the second conductor 22 is referred to as "second terminal 13", and the terminal that is electrically connected to the conductive pattern 31 formed on the substrate 30 is referred to as "third terminal 14".

An example of the electronic component 10 is an FET (transistor). In this case, a source terminal corresponds to the first terminal 12, a drain terminal corresponds to the second terminal 13, and a gate terminal corresponds to the third terminal 14. A source terminal, which is the first terminal 12, and a gate terminal, which is the third terminal 14, are located on one side of the FET (transistor), which is the electronic component 10 in the present embodiment, and a drain terminal, which is the second terminal 13, is located on the opposite side. The terminals are located below the main body 11. Specifically, part of the terminals is exposed at the bottom surface of the main body 11.

Note that for easy understanding of the description, it is assumed that the electronic component 10 in the description below has one first terminal 12, one second terminal 13, and one third terminal 14. However, the number of terminals of each type included in the electronic component 10 need not be one. A plurality of such electronic components 10 may also be provided.

The conductive members 20 are plate-shaped members for supporting the electronic component 10. The conductive members 20 are formed into a predetermined shape through pressing, for example. The conductive members 20 are also referred to as "bus bars" (bus bar plates) or the like. The conductive members 20 constitute a circuit that is different from (electrically independent of) the circuit constituted by the conductive pattern 31 formed on the substrate 30. In the present embodiment, the conductive members 20 constitute power lines, and the conductive pattern 31 formed on the substrate 30 constitutes a signal wire. That is, by turning on/off of the FET, which is the electronic component 10, through the conductive pattern 31, the supply of power to the power lines constituted by the conductive members 20 is controlled.

The conductive members 20 in the present embodiment include the first conductor 21 and the second conductor 22 that are fixed to the substrate 30 in a state in which they are separated from each other. That is, the first conductor 21 and the second conductor 22 are not directly electrically connected to each other. A heat dissipation member 50, which will be described later, a casing (not shown) for accommodating the circuit assembly 1, and the like maintains a state in which the first conductor 21 and the second conductor 22 have a predetermined positional relationship (separated state). As described above, the first terminal 12 of the electronic component 10 is electrically connected to the first conductor 21. The second terminal 13 of the electronic component 10 is electrically connected to the second conductor 22. Note that a plurality of the first conductors 21 and a plurality of the second conductors 22 may also be used in accordance with the number of electronic components 10.

The electronic component 10 (main body 11) is mounted so that it reaches from the first conductor 21 to the second conductor 22 that are arranged with a gap therebetween. The first terminal 12 is connected to the first conductor 21, and the second terminal 13 is connected to the second conductor 22. The third terminal 14 of the electronic component 10 is located on the same side as the first terminal 12. In the present embodiment, the first conductor 21 of the conductive member 20 is provided with a notch 211 obtained by cutting out a portion of the first conductor 21, and this notch 211 and the third terminal 14 overlap with each other in the height direction. Specifically, side edges of the first conductor 21 and the second conductor 22 that face each other are located approximately in parallel to each other, and a portion of the first conductor 21 is cut out in a direction away from the second conductor 22 (forming a recessed shape in plan view), and the notch 211, which is the cut out portion, and the third terminal 14 overlap with each other. That is, the conductive member 20 (the first conductor 21) does not overlap with the third terminal 14 in the height direction, and the third terminal 14 is not covered by the conductive member 20, but is exposed (see FIG. 3). Although the conductive member 20 (the first conductor 21) does not overlap with the entire third terminal 14 in the present embodiment, the conductive member 20 may also overlap with a portion of the third terminal 14, without overlapping with the other portions thereof. As will be described later, since the third terminal 14 is electrically connected to the terminal connection portion, a structure is preferable in which the third terminal 14 does not overlap with the conductive member 20 at least on the side of the terminal connection portion. Note that if such a structure is adopted and a portion of the third terminal 14 overlaps with the conductive member 20 (the first conductor 21), then they are insulated from each other in order to avoid a short circuit.

Figure 2:
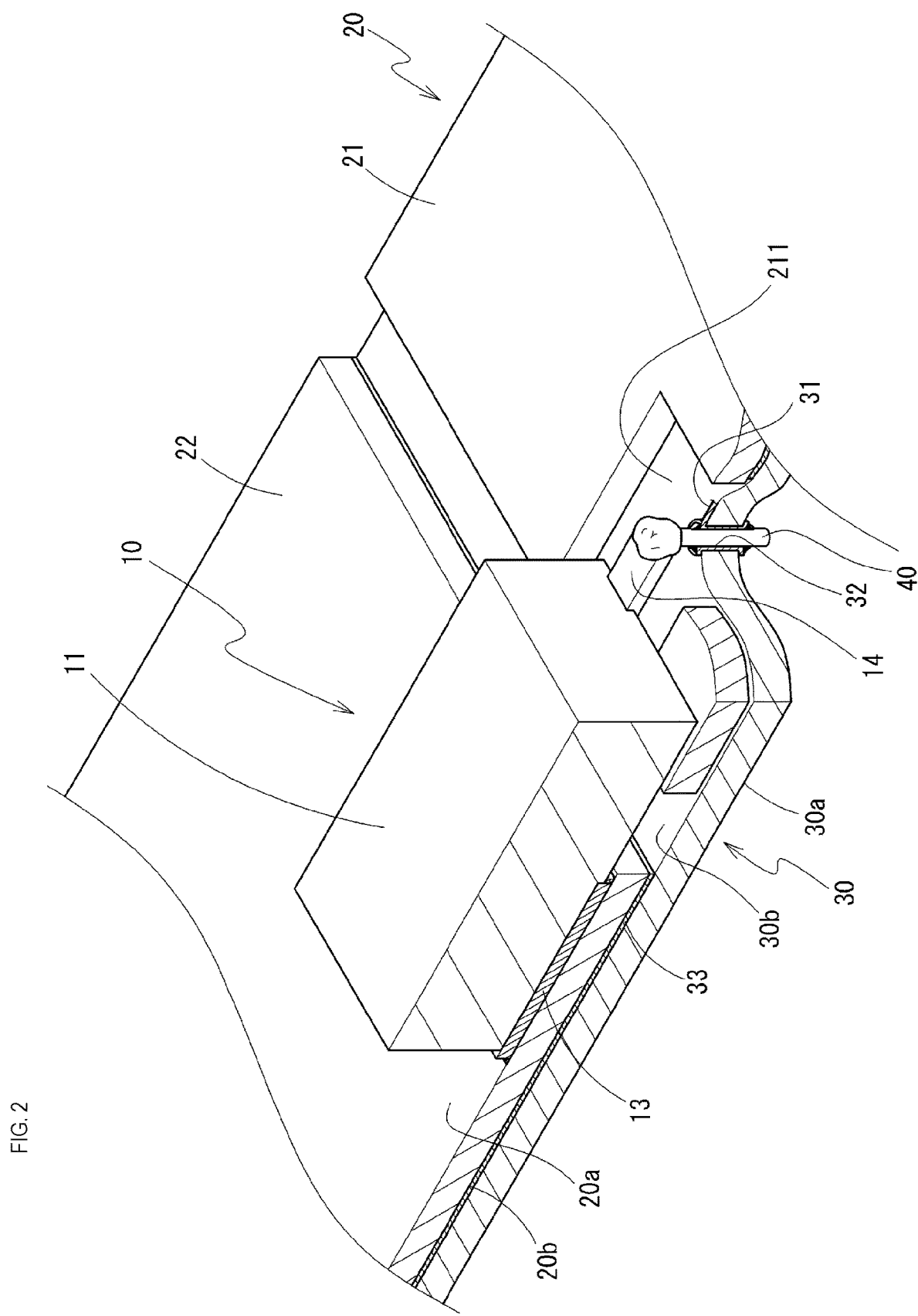
FIG. 2 is a partially cut-away vertical cross-sectional view of a part of the circuit assembly according to one embodiment of the present invention (a heat dissipation member is omitted).
Figure 3:
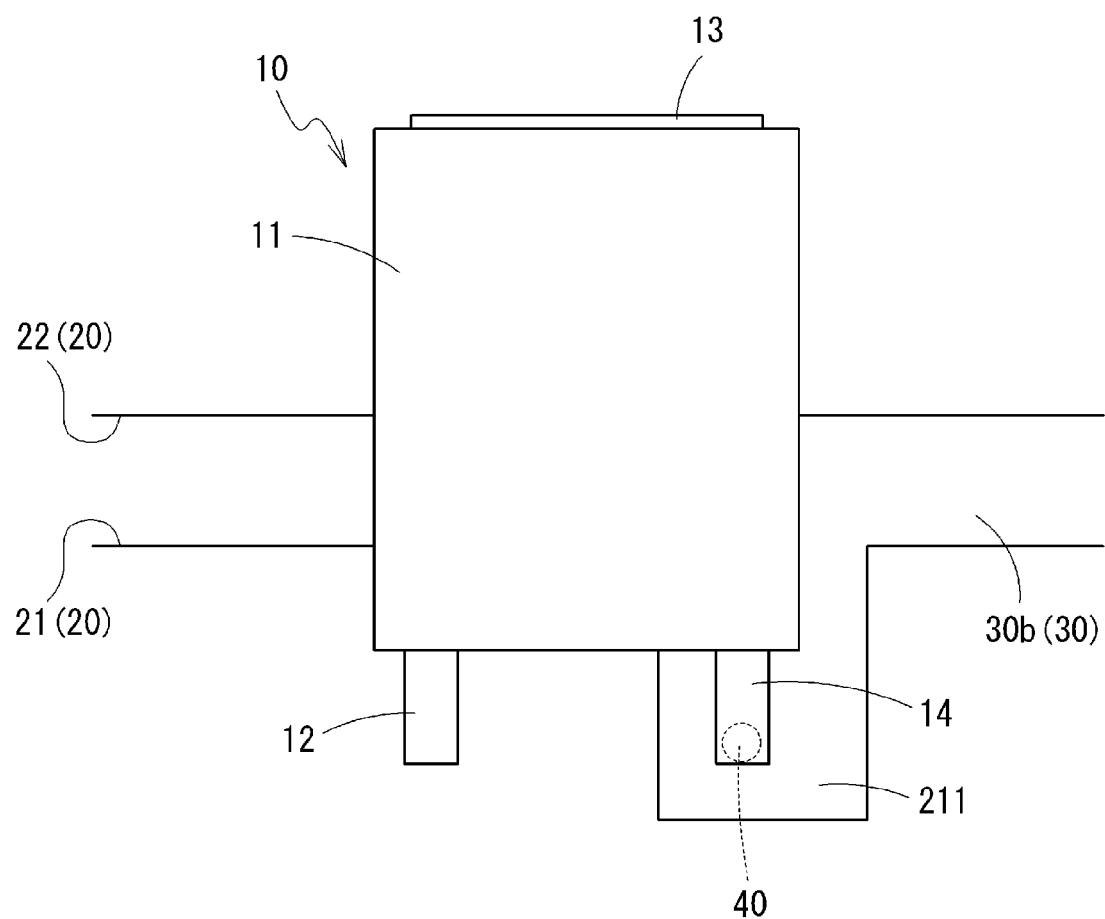
FIG. 3 is a plan view of the circuit assembly from which the heat dissipation member is omitted according to one embodiment of the present invention (plan view of a portion below the substrate).

The substrate 30 is provided with a conductive pattern 31 (for easy understanding of the drawings, only portions are shown in FIGS. 1 and 2) made of a conductive thin film. The conductive pattern 31 is connected to the third terminal 14, which is the gate terminal of the FET, which is a switching element. In the present embodiment, such a conductive pattern 31 is formed on one side 30a (lower surface) of the substrate 30.

In the present embodiment, the substrate 30 is fixed to the lower surface (surface opposite to the support surface 20a. Hereinafter, the lower surface is also referred to as "opposite surface 20b") of the conductive member 20. In the present embodiment, the other side 30b (lower surface) of the substrate 30 is joined to the opposite surface 20b of the conductive member 20 via an insulating adhesive layer 33. That is, the other surface 30b, which is the surface opposite to the one side 30a provided with the conductive pattern 31, serves as a joining surface.

The third terminal 14 of the electronic component 10 and the conductive pattern 31 formed on the substrate 30 are electrically connected to each other via a relay member 40. The relay member 40 in the present embodiment is connected to a front end of the third terminal 14 extending in the surface direction and has a linear shape extending in the height direction. One end of the relay member 40 is connected to the third terminal 14, and the other end passes through a through hole 32 formed in the substrate 30. The other end of the relay member 40 that has passed through the through hole 32 is connected to the conductive pattern 31 via a conductive material such as solder.

As described above, the conductive member 20 is provided with the notch 211, and thus the conductive member 20 does not overlap with the third terminal 14 due to this notch 211. Therefore, the relay member 40 can be disposed passing through the notch 211, and the third terminal 14 and the relay member 40 can be easily connected.

The heat dissipation member 50 is in direct or indirect contact with the support surface 20a of the conductive member 20. Specifically, the heat dissipation member 50 is directly or indirectly joined to a range, of the support surface 20a of the conductive member 20, in which the electronic component 10 does not overlap with the heat dissipation member 50. It is preferable that an insulating material 51 having excellent thermal conductivity is interposed therebetween.

The heat dissipation member 50 is provided on the same side of the conductive member 20 as the electronic component 10, and thus, it is necessary to prevent the electronic component 10 from getting in the way of the heat dissipation member 50. The heat dissipation member 50 in the present embodiment is provided with an accommodation space 52, which is a recess that is recessed upward from the bottom (the lower portion is open), and at least a portion of the electronic component 10 (main body 11) enters this accommodation space 52. Moreover, the portion of the heat dissipation member 50 where the accommodation space 52 is not formed is in direct or indirect contact with the support surface 20a of the conductive member 20, and thus, heat generated by the electronic components 10 or the other components is dissipated from the heat dissipation member 50 through the conductive member 20.

It is preferable that the electronic components 10 and the heat dissipation member 50 are in direct or indirect contact with each other. This is so that in that case, heat generated by the electronic components 10 is transmitted to the heat dissipation member 50 without passing through the conductive member 20. As shown in FIG. 1, a structure is preferably adopted in which the electronic components 10 and an inner wall surface of the accommodation space 52 that is formed in the heat dissipation member 50 are in direct or indirect contact with each other. A structure in which the electronic components 10 and the heat dissipation member 50 are in indirect contact with each other via some kind of material is more preferable than a structure in which the electronic components 10 and the heat dissipation member 50 are in direct contact with each other. Because an air layer inhibits heat transmission therebetween, a transmission material 60 having excellent thermal conductivity is preferably interposed therebetween. This is because in that case, the heat dissipation efficiency increases when the transmission material 60 as described above is interposed therebetween because a minute air layer is present even if a structure is adopted in which the electronic components 10 and the heat dissipation member 50 are in direct contact with each other.

Note that a configuration may also be adopted in which the heat dissipation member 50 (and the insulating material 51) is not provided. With such a configuration, it is possible to ensure a certain level of heat dissipation performance through the conductive member 20.

As described above, in the embodiment 1 according to the present embodiment, the substrate 30 is fixed to the surface of the conductive member 20 that is opposite to the surface of the conductive member 20 that supports the electronic components 10, and thus it is not necessary to form through-holes or the like for passing the electronic components 10 through the substrate 30, and accordingly, it is possible to increase the mounting area of the substrate 30.

Although the embodiment of the present invention has been described in detail above, the present invention is not merely limited to the above-described embodiment, and it will be appreciated that various modifications can be made without departing from the gist of the present invention.

LIST OF REFERENCE NUMERALS

1 Circuit assembly
10 Electronic component (transistor)
11 Main body
12 First terminal (source terminal)
13 Second terminal (drain terminal)
14 Third terminal (gate terminal)
20 Conductive member
20a Support surface
20b Opposite surface
21 First conductor
211 Notch
22 Second conductor
30 Substrate
30a One side
30b Other side
31 Conductive pattern
40 Relay member
50 Heat dissipation member
51 Insulating material
52 Accommodation space
60 Transmission material

The invention claimed is:

1. A circuit assembly comprising:
an electronic component having a main body and a plurality of terminals disposed on an undersurface of the main body;
a plurality of bus bars spaced apart from each other, a pair of the plurality of bus bars spaced apart from each other so as to define a gap, the pair of bus bars supporting the electronic component, at least one of the terminals of the electronic component being electrically connected to one of the pair of bus bars, an end portion of the main body of the electric component is mounted to the one of the pair of bus bars and another end portion of the main body of the electronic component is mounted to the other of the pair of bus bars so as to have a mid-portion of the main body of the electric component disposed above the gap; and
a substrate provided with a conductive pattern to which another terminal or other terminals of the electronic component are electrically connected,
wherein the substrate is fixed to a surface of the pair of bus bars that is opposite to a surface of the pair of bus bars that supports the electronic component, and
the circuit assembly is provided with a heat dissipation member that is in direct or indirect contact with the surface of the pair of bus bars that supports the electronic component.

2. The circuit assembly according to claim 1, comprising:
a relay member directly coupled to the other terminal or terminals of the electronic component so as to link the other terminal or terminals of the electronic component to the conductive pattern of the substrate.

3. The circuit assembly according to claim 2, wherein an accommodation space for accommodating the electronic component is formed in the heat dissipation member.

4. The circuit assembly according to claim 2, wherein the electronic component and the heat dissipation member are in direct or indirect contact with each other.

5. The circuit assembly according to claim 2, wherein the relay member is disposed within a cut out of the other of the pair of bus bars.

6. The circuit assembly according to claim 1, wherein an accommodation space for accommodating the electronic component is formed in the heat dissipation member.

7. The circuit assembly according to claim 6, wherein the electronic component and the heat dissipation member are in direct or indirect contact with each other.

8. The circuit assembly according to claim 1, wherein the electronic component and the heat dissipation member are in direct or indirect contact with each other.

\* \* \* \* \*